United States Patent [19]

King et al.

[11] Patent Number: 6,025,715
[45] Date of Patent: Feb. 15, 2000

[54] METHOD FOR COMPENSATING AN MRI SYSTEM FOR TIME DEPENDENT GRADIENT FIELD DISTORTION

[76] Inventors: Kevin F. King, 15651 W. Ridge Rd., New Berlin, Wis. 53151; Alexander Ganin, 6100 N. Lake Dr., Whitefish Bay, Wis. 53217

[21] Appl. No.: 08/990,610

[22] Filed: Dec. 15, 1997

[51] Int. Cl.$^7$ ...................................................... G01V 3/00
[52] U.S. Cl. ........................ 324/309; 324/320; 600/419
[58] Field of Search ................................. 324/309, 312, 324/308, 320, 306; 600/419

[56] References Cited

U.S. PATENT DOCUMENTS 4,591,789  5/1986  Glover et al. ............................ 324/307
4,698,591  10/1987 Glover et al. ............................ 324/307
4,950,994  8/1990  Glover et al. ............................ 324/320

OTHER PUBLICATIONS

*Response Surface Methodology*, Ch. 1, pp. 1–11.

*Primary Examiner*—Christine K. Oda
*Assistant Examiner*—Brij B. Shrivastav
*Attorney, Agent, or Firm*—Barry E. Sammons; Christian G. Cabou; Phyllis Y. Price

[57] ABSTRACT

An MRI system performs a calibration procedure to calculate optimal compensation parameter values for a pre-emphasis filter that alters the shape of gradient waveforms. The gradient field errors are measured using a series of pulse sequences in which different compensation parameter values are sampled. The measured errors are used to calculate a gradient error function and the optimal compensation parameter values are calculated by finding the minimum in the gradient error function.

6 Claims, 4 Drawing Sheets

METHOD FOR COMPENSATING AN MRI SYSTEM FOR TIME DEPENDENT GRADIENT FIELD DISTORTION

BACKGROUND OF THE INVENTION

The field of the invention is nuclear magnetic resonance imaging methods and systems. More particularly, the invention relates to the measurement of and subsequent compensation for non-idealities in the magnetic field gradients produced by such MRI systems.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned magnetic moment, $M_z$, may be rotated, or "tipped", into the x-y plane to produce a net transverse magnetic moment $M_t$. A signal is emitted by the excited spins, and after the excitation signal $B_1$ is terminated, this signal may be received and processed to form an image.

The application of magnetic resonance to imaging, and to many of the techniques of localized spectroscopy, depend upon the use of linear magnetic field gradients to selectively excite particular regions and to encode spatial information within the NMR signal. During the NMR experiments, magnetic field gradient waveforms with particularly chosen temporal variations are used. Any departure from the application of ideal magnetic field gradient waveforms can, therefore, be expected to introduce image distortion, intensity loss, ghosting, and other artifacts. For example, imperfect rephasing of the nuclear spins and an attendant loss of signal occurs if the magnetic field gradients are not constant during selective time reversal pulses (i.e. use of 180° time reversal RF pulses). This effect compounds in later spin echoes of multi-echo (Carr-Purcell-Mieboom-Gill) sequences. In addition, if the gradient field is not zero when it should be (due to residual decay after termination of a gradient pulse), the unintended phase dispersion can result in distorted spectra in chemical shift imaging (CSI) sequences as well as inaccurate spin-spin relaxation time ($T_2$) determination in multi-echo sequences. Those skilled in the art are thus concerned particularly about the accuracy with which time varying magnetic field gradients are produced.

Distortion in the production of magnetic field gradients can arise if the gradient fields couple to lossy structures within the polarizing magnet such as its cryostat (if the magnet is of the superconductive design), or the shim coil system, or the RF shield used to decouple the gradient coils from the RF coil. One source of gradient distortions derives from the induction of currents in these ambient structures and from the loss of energy to the shim coils. These induced currents are known as eddy currents. Due to eddy currents, one observes, typically an exponential rise and decay of the magnetic field gradient during and after, respectively, the application of a trapezoid current pulse to the gradient coil.

In U.S. Pat. No. 4,698,591 entitled "A Method for Magnetic Field Gradient Eddy Current Compensation," a method is disclosed which uses an analog pre-emphasis filter in the gradient power supply to shape the current applied to the gradient coil in such a way that the eddy current induced gradient field distortions are reduced. The filter includes a number of exponential decay components and adjustable potentiometers which must be set during system calibration. A measurement technique is used prior to system calibration in which the impulse response of the uncorrected magnetic field gradient is measured and the potentiometer settings for the pre-emphasis filter are then calculated. Such techniques are described in U.S. Pat. Nos. 4,950,994; 4,698,591 and 4,591,789.

The development of faster imaging techniques such as Echo Planar Imaging (EPI), together with the development of faster gradient hardware to support such techniques, have placed greater demands on the accuracy of the generated gradient fields. Faster imaging methods are more sensitive to short term inaccuracies in the gradient fields, and it has been discovered that the prior compensation methods do not provide accurate correction to the gradient waveforms for these fast imaging methods.

SUMMARY OF THE INVENTION

The present invention is an improved method for measuring the errors in magnetic field gradients and for compensating the gradient waveforms to offset such errors. More specifically, the method includes measuring the gradient errors produced when compensation parameters employed in a gradient corrective circuit are set to a plurality of sample values for a plurality of gradient waveforms; calculating a gradient error function by fitting the measured gradient errors to a polynomial which expresses the gradient error as a function of the compensation parameters; calculating the optimal set of compensation parameters by finding the compensation parameters which minimize the gradient error function; and employing the optimal compensation parameters in the gradient corrective circuit of an MR system to acquire NMR data.

A general object of the invention is to correct time dependent, short term errors in the gradient fields produced by an MR system. No assumptions are made about the nature of the gradient errors that are produced. Instead, the gradient errors are actually measured with the compensation parameters set to a wide range of sample values. From this the optimal settings can be calculated by minimizing the gradient error function,

DESCRIPTION OF THE PREFERRED EMBODIMENT

Figure 1:
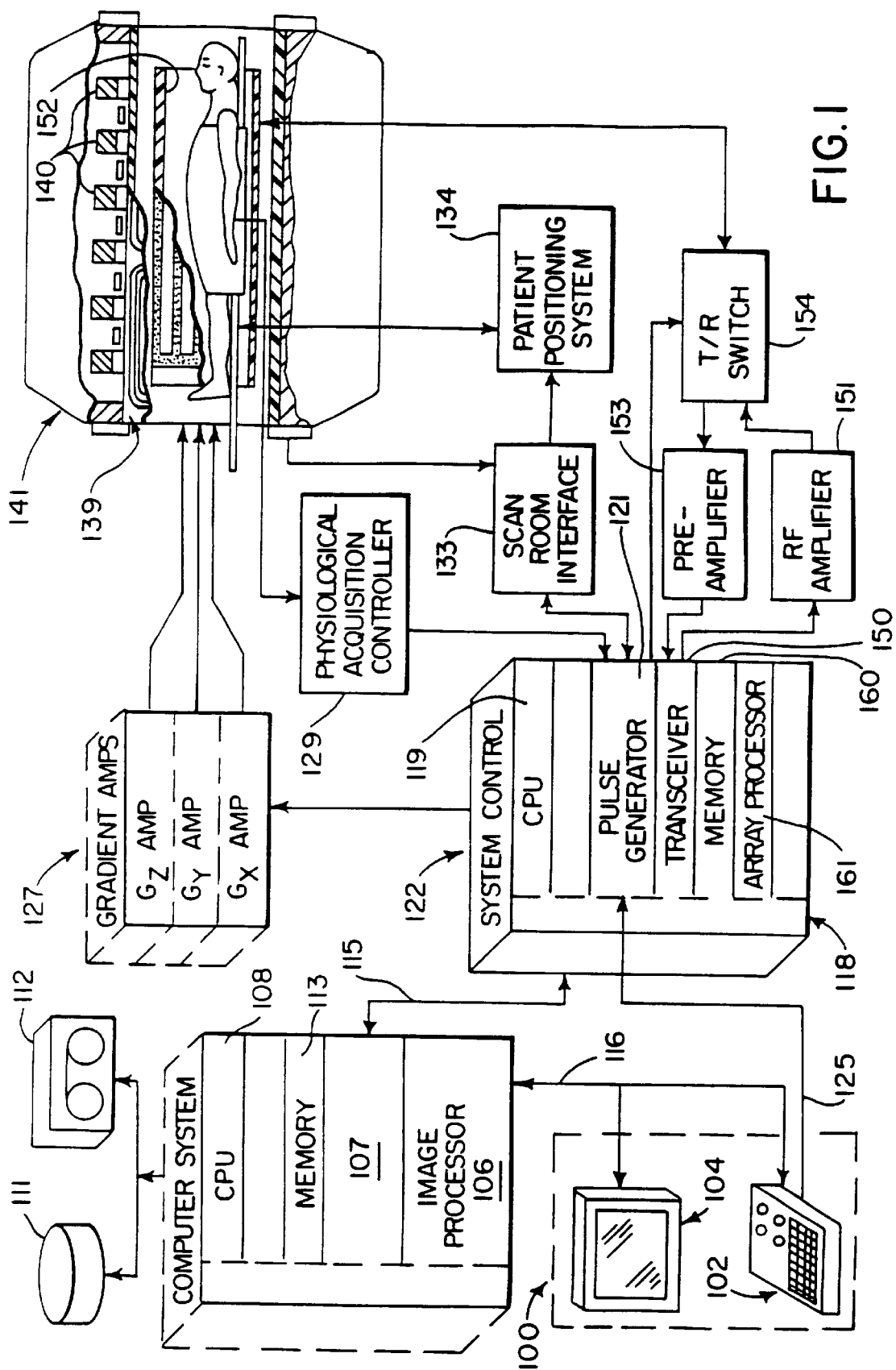
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$, and $G_z$ amplifiers. Each gradient amplifier excites a corresponding gradient coil in an assembly generally designated 139 to produce the linear magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to transform the data into an array of image data. This image data is conveyed through the serial link 115 to the computer system 107 where it is stored in the disk memory 111. In response to commands received from the operator console 100, this image data may be archived on external drive 112, or it may be further processed by the image processor 106 as will be described in more detail below and conveyed to the operator console 100 and presented on the display 104.

For a more detailed description of the transceiver 150, reference is made to U.S. Pat. Nos. 4,952,877 and 4,992,736 which are incorporated herein by reference.

The present invention enables the MRI system of FIG. 1 to be periodically tested to measure the errors in the applied magnetic field gradients and calculate compensating circuit values that are used to offset the measured errors.

Figure 2:
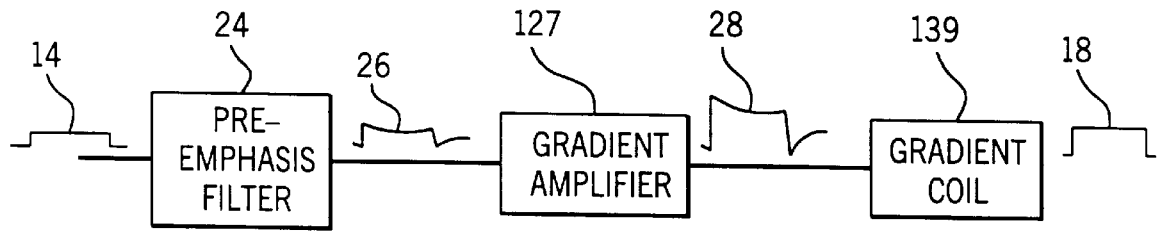
FIG. 2 is a block diagram of the gradient field producing elements which form part of the MRI system of FIG. 1.

As is well know in the art, gradient field distortion can be offset by application of a current pulse 14, as shown in FIG. 2, to a pre-emphasis filter 24 to predistort the current pulse, as indicated at 26. As a result, the amplified current pulse 28 applied to the gradient coil 139 produces the desired rectangular magnetic field gradient pulse 18. Since in a typical MR application, gradient pulses are applied in each of the axes of the Cartesian coordinate system, an MR system for practicing the invention would have means functionally similar to that depicted in FIG. 2 to achieve correction along all three axes. However, for simplicity, the following discussion will refer to correction along only one of the axes.

Figure 3:
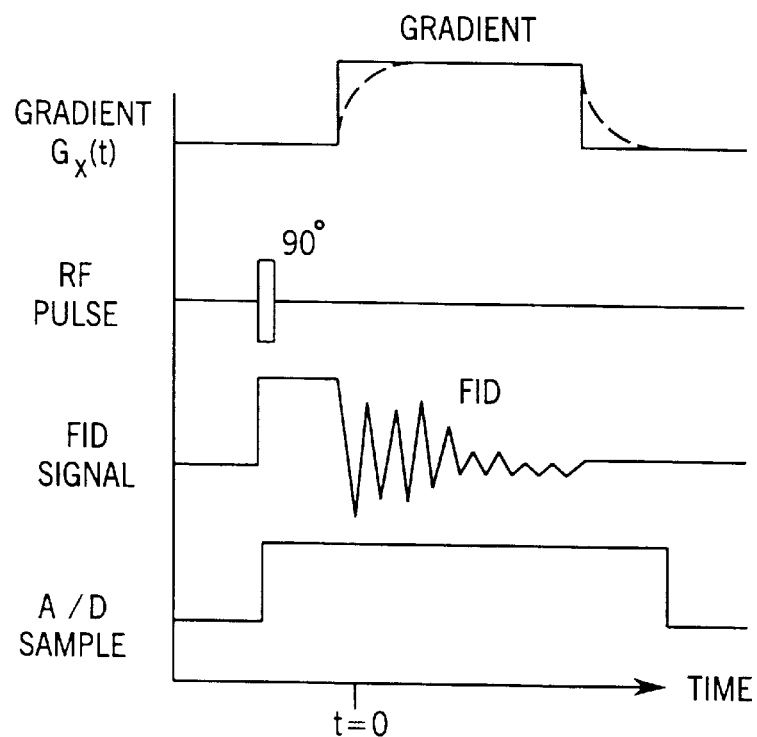
FIG. 3 is a graphic representation of a pulse sequence employed by the MRI system of FIG. 1 to practice the preferred embodiment of the invention.

In order to determine how current pulse 14 in FIG. 2 should be shaped and, therefore, how pre-emphasis filter 24 should be constructed to achieve the desired shape, the nature of the distortion to be eliminated must first be measured and analyzed. Two samples, each composed of an MR active substance, for example, a ¼ inch diameter acrylic tube containing approximately 0.4 cc of 0.5M $CuSO_4$ doped water are positioned respectively at a distance "$x_1$" and "$x_2$" from the gradient origin designated "0" (that is, the system isocenter). These samples serve as the source of the NMR signals used to measure the distortions caused by magnetic field gradient pulses $G_x$. FIG. 3 shows the pulse sequence employed to produce the NMR signals (FID) for one sample and for one axis. As previously indicated, the sequence is repeated for the other axes along which gradients requiring compensation are applied.

The measurement sequence is comprised of a gradient pulse followed by the application of a 90° RF pulse which generates a free induction decay (FID) signal. It there are no time-dependent magnetic field components produced by the gradient pulse, then the sample object will be immersed in a homogeneous, constant magnetic field for the entire duration of the gradient pulse. As a result, the instantaneous frequency of the FID will be constant as a function of time. If, however, the gradient pulse is accompanied by time dependent magnetic field components as shown by the dashed curve in FIG. 3, then the magnetic field at the sample object will vary during the FID and so will the instantaneous phase and frequency of the FID signal. By taking the derivative of the FID signal, the magnitude of the time dependent response of the system to the gradient pulse can be measured. For a more detailed description of the method used to measure the time dependent response, or error, in the gradient field, reference is made to U.S. Pat. No. 4,950,994 which issued on Aug. 21, 1990 and is incorporated herein by reference.

Figure 4:
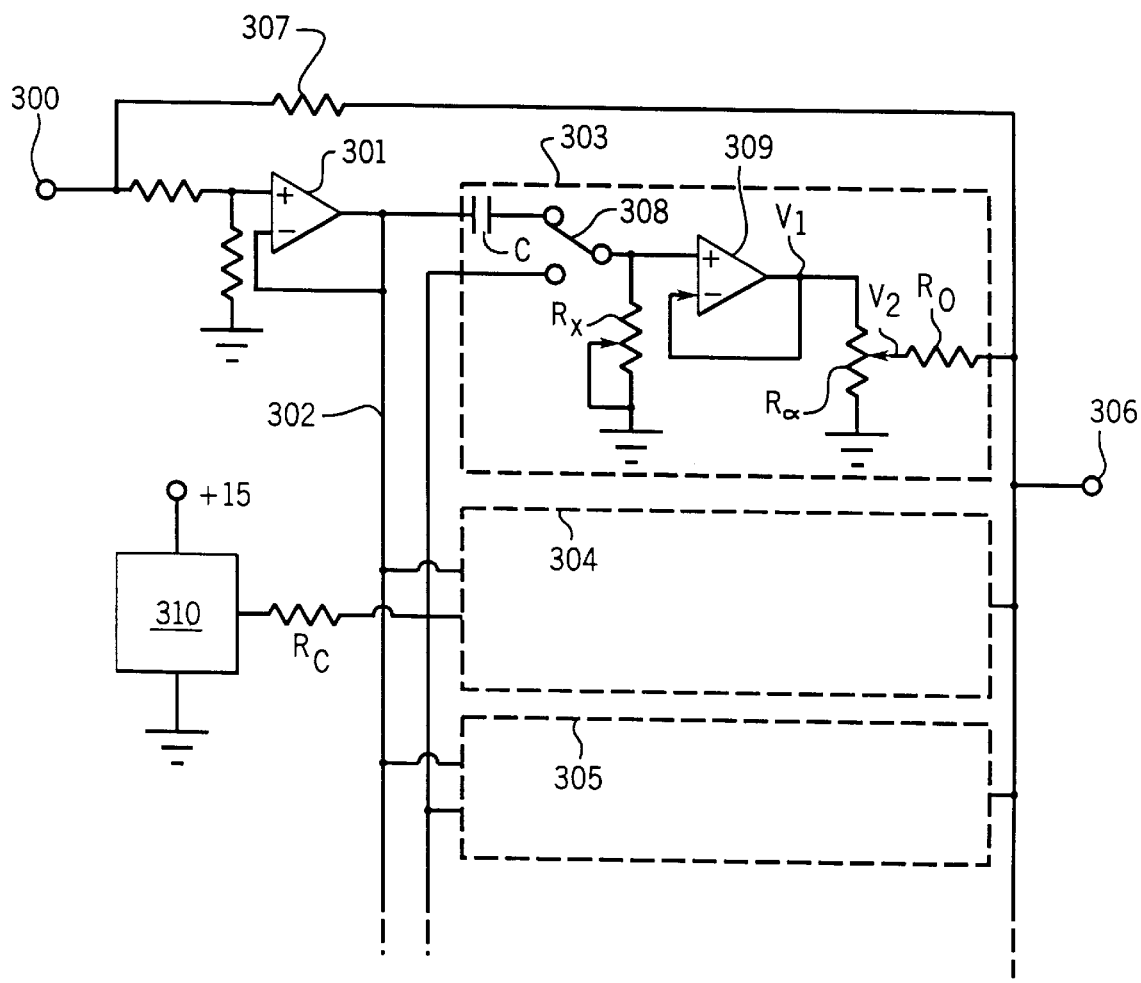
FIG. 4 is an electrical schematic diagram of the pre-emphasis filter that forms one block in FIG. 2.

Referring to FIG. 4, a preferred embodiment of the compensation filter includes an input terminal 300 which connects to operational amplifier 301. The output of the amplifier 301 connects to bus 302 which serves as the input to a plurality of exponential circuits indicated by the dashed lines 303–305. The outputs of the exponentials circuits 303–305 connect to a common filter output terminal 306, and a feedback resistor 307 connects this filter output 306 back to the input terminal 300. Although three exponential circuits 303–305 are shown, it should be apparent that the number will depend on the results of the MR measurements and the degree of accuracy required to provide adequate results.

Referring still to FIG. 4, each exponential circuit 303–305 includes a coupling capacitor C at its input which connects through a single-pole-double throw switch 308 to an operational amplifier 309. A potentiometer $R_x$ also connects to the input of operational amplifier 309 and it forms an R-C circuit with the capacitor C. A second potentiometer $R_\alpha$ connects to the output of amplifier 309 and its wiper contact connects through a resistor $R_0$ to the filter output terminal 306. The potentiometers $R_x$ and $R_\alpha$ are adjusted to provide the proper time constant $\tau_i$ and overshoot fraction $\alpha_i$. The adjustment is performed by a calibration step in which the switch 308 is toggled to apply a ten volt reference 310 through a resistor $R_C$ to the operational amplifier 309. The potentiometer $R_x$ is then set to provide a predetermined voltage $V_1$ at the output of the operational amplifier 309, and potentiometer $R_\alpha$ is then set to provide a predetermined voltage $V_2$ at its wiper. The predetermined voltages $V_1$ and $V_2$ are calculated using the values of $\tau_i$ and $\alpha_i$, as well as the values of the circuit components. Each exponential circuit 303–305 is separately calibrated in this fashion and the switch 308 is returned to its operating position. The compensation filter, therefore, includes one or more exponential circuits which provide the compensation to the signal applied to its input 300. It should be apparent to those skilled in the art that other gradient waveform pre-emphasis methods may be used. For example, the pre-emphasis can be done digitally as described in U.S. Pat. No. 5,289,127, entitled "Correction of Signal Distortion In An NMR Apparatus" which is incorporated herein by reference.

The present invention is a method for calculating the optimum compensation parameters $\tau_i$ and $\alpha_i$ for the compensation filter 24. The process for accomplishing this is indicated by the flow chart in FIG. 5 and it is carried out as a calibration procedure for the MRI system of FIG. 1.

Unlike prior methods which presume that the gradient distortion is due solely to Eddy currents and that this distortion can be modeled using a linear system with an exponential response, the first objective of the present invention is to actually measure the gradient distortion as a function of the compensation parameter settings. As indicated at process block 200 the first step in the process is to produce a schedule which lists the various settings of the compensation parameters $\tau_i$ and $\alpha_i$ and various gradient waveforms that will be used to "sample" the gradient distortion function. In the preferred embodiment, three values of $\alpha_i$ and three values of $\tau_i$ are required for each sample measurement. Each of the six compensation parameters should be set to values that range well to each side of the expected optimal value and then all the combinations and permutations of these settings should be sampled in what is sometimes referred to as a full factorial experiment. This would require 729 separate measurements to sample each compensation parameter at just three values for each of the three $\alpha_i$ and $\tau_i$. In the preferred embodiment, however, a central composite design such as that described in "Response Surface Methodology" by R. H. Myers and D. C. Montgomery, Wiley, 1995, is used to produce a sample schedule that requires only 53 measurements for each gradient axis and for each gradient waveform.

Referring again to FIG. 5, the next step is to produce the gradient waveform at process block 201 and measure the gradient error produced with each sample setting of the compensation parameters, as indicated at process block 202. The pulse sequence in FIG. 3 is used for each measurement after the sample set of compensation parameters are downloaded to the compensation filter 24. The derivative of the phase of the acquired FID signal is calculated to measure the magnitude of the gradient error $$G_{error}(i,j) = G_{measured}(i,j) - G_{ideal}(i,j)$$

for each waveform i and each time interval j, where $i=1 \ldots N$ and $j=1 \ldots M$ at the sample set of compensation parameters. The maximum error occurring in three separate time intervals after the gradient is switched are recorded and used in the computations to follow. The first time interval is 0 to 200 microseconds, the second time interval is 200 to 500 microseconds, and the third time interval is 500 to 1000 microseconds. It has been discovered that the gradient errors are caused by many factors other than induced eddy currents including gradient driver non-linear effects and capacitive effects in the gradient coil, and that these factors affect the gradients over different time intervals following a step change in the gradient waveform. For example, non-linearities in the gradient amplifiers and anomalies in the gradient coil structure have been found to produce significant short term gradient errors during the first time interval. These errors were not seen, or compensated for in prior methods which tried to fit the measured gradient errors to an exponentially decaying function characteristic of eddy current errors.

Figure 5:
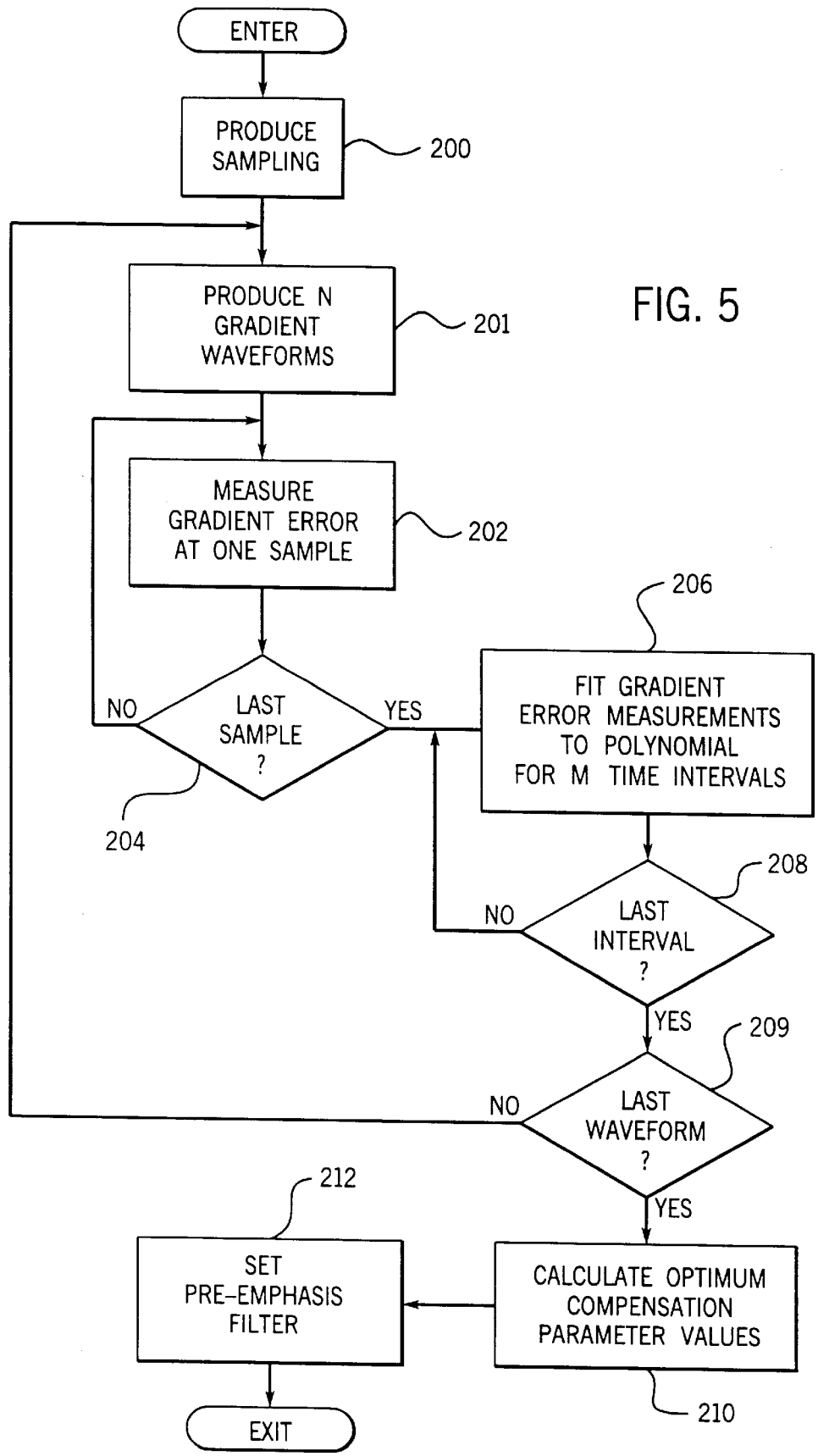
FIG. 5 is a flow chart of the calibration process used by the MRI system of FIG. 1 to practice the present invention.

Referring still to FIG. 5, a loop is established in which the three gradient error values are measured at each sample set of compensation parameters listed in the schedule produced at process block 200. This process can be visualized as repeatedly setting the compensation parameters and operating the MRI system to measure the resulting gradient errors using the pulse sequence of FIG. 3. The compensation parameters are set to a range of values during this sampling process which encompass the sought after optimal setting. The resulting gradient error values provide a picture of the response surface, i.e. how the MRI system responds to the different settings of the compensation parameters. More specifically, the measured gradient errors sample the gradient error function of the particular MRI system. When this sampling is completed, as determined at decision block 204, the gradient error function is calculated from the sample values that were measured.

Referring still to FIG. 5, the gradient error function is calculated next at process block 206 by fitting the sample values to a polynomial equation. Many different polynomial equations can be used, but in the referred embodiment a quadratic equation with six variables is used because the second order terms and the cross terms are believed sufficient to accurately define the gradient error function. Mathematically, the equation is:

$$\begin{aligned}
G_{error}(i, j) = {} & C_0(i, j) + C_1(i, j)\tau_1 + C_2(i, j)\tau_2 + C_3(i, j)\tau_3 + \\
& C_4(i, j)\alpha_1 + C_5(i, j)\alpha_2 + C_6(i, j)\alpha_3 + C_7(i, j)\tau_1^2 + \\
& C_8(i, j)\tau_2^2 + C_9(i, j)\tau_3^2 + C_{10}(i, j)\alpha_1^2 + C_{11}(i, j)\alpha_2^2 + \\
& C_{12}(i, j)\alpha_3^2 + C_{13}(i, j)\tau_1\tau_2 + C_{14}(i, j)\tau_1\tau_3 + \\
& C_{15}(i, j)\tau_1\alpha_1 + C_{16}(i, j)\tau_1\alpha_2 + C_{17}(i, j)\tau_1\alpha_3 + \\
& C_{18}(i, j)\tau_2\tau_3 + C_{19}(i, j)\tau_2\alpha_1 + C_{20}(i, j)\tau_2\alpha_2 +
\end{aligned}$$

-continued $$C_{21}(i,j)\tau_2\alpha_3 + C_{22}(i,j)\tau_3\alpha_1 + C_{23}(i,j)\tau_3\alpha_2 +$$
$$C_{24}(i,j)\tau_3\alpha_3 + C_{25}(i,j)\alpha_1\alpha_2 + C_{26}(i,j)\alpha_1\alpha_3 +$$
$$C_{27}(i,j)\alpha_2\alpha_3$$

Many methods are known in the art for fitting the measured errors to a polynomial, including for example, the methods described by D. C. Hoaglin and R. E. Welsch (1978), "The Hat Matrix in Regression and ANOVA," *The American Statistician* 32. pp. 17–22, and Corrigenda 32, p. 146; P. F. Velleman, J. Seaman, and I. E. Allen (1977), "Evaluating Package Regression Routines," ASA 1997 *Proceedings of the Statistical Computing Section*; and S. Weisberg (1980), *Applied Linear Regression*, John Wiley & Sons, Inc. In the preferred embodiment a least squares fit method is used which is commercially available from Minitab, Inc. of State College, Pennsylvania. and sold under the trademark "Minitab".

The result of the fitting process 206 is a set of coefficients $C_k$ where k=0 ... 27 which define the quadratic equation for the gradient error function. This process 206 is performed NM times, once for each of the N gradient waveforms and each of the M time intervals. When the M sets of coefficients have been calculated as determined at decision block 208, the system loops at decision block 209 N times and then the system continues on to determine the compensation parameter settings that will produce minimum gradient errors.

Referring still to FIG. 5, the optimal settings are calculated by finding the minimum in the gradient error function as indicated at process block 210. Mathematically the function $$G_{error} = \sum_i \sum_j w(i,j) G_{error}(i,j)$$

is minimized where w(i,j) are weighting factors chosen to optimize the results. As an example w(i,j)=1 could be used.

Finding the minimum in a function expressed as a quadratic equation is a well known problem for which there are many well known solutions. In the preferred embodiment a non-linear optimization method is used which is commercially available as a program from Microsoft, Inc. It is a non-linear least squares optimizer entitled "SOLVER" which is part of a product sold under the trademark "EXCEL". In the preferred embodiment there are three separate gradient error functions corresponding to the three separate time intervals and the sum of these three separate functions are minimized. All three functions are weighted equally in the preferred embodiment, but it is recognized that in some MRI systems it may be preferably to weight each time interval differently. The output of the minimization process is a set of six compensation parameter values ($\alpha_1, \alpha_2, \alpha_3, \tau_1, \tau_2$ and $\tau_3$) which will produce the minimum gradient errors when used in the MRI system of FIG. 1. This set of optimum compensation parameter values are used to set the pre-emphasis filter 24 as indicated at process block 212. While this last step is performed by adjusting the potentiometers in the analog circuit of FIG. 4, other corrective circuits are also known and the corrections can be made automatically when digital correction circuits or software are employed.

It has been found that by actually calculating the gradient error function rather than making assumptions about its shape as is done in prior rt methods, the time-dependent gradient errors can be reduced considerably. The invented method is particularly adept at compensating for errors produced by gradient amplifier non-linearities and gradient coil anomalies.

We claim:

1. A method for compensating the magnetic field of an MR system, the steps comprising:
    a) setting compensation parameters for a corrective circuit in the MR system to a set of sample values;
    b) performing a pulse sequence using the MR system and measuring the error produced in the magnetic field;
    c) repeating steps a) and b) to measure the error in the magnetic field at different sets of sample values;
    d) calculating a gradient error function by fitting the measured errors to a polynomial, the gradient error function expressing the error produced in the magnetic field as a function of the compensation parameters;
    e) calculating an optimal set of compensation parameter values by finding the minimum in the gradient error function; and
    f) using the optimal compensation parameter values in the corrective circuit of the MR system to acquire NMR data.

2. The method as recited in claim 1 in which the different sets of sample values are chosen in step c) using a central composite design.

3. The method as recited in claim 1 in which the polynomial is a quadratic equation.

4. The method as recited in claim 1 in which there are six compensation parameter values in each sample.

5. The method as recited in claim 1 in which the error produced in the magnetic field is measured at a plurality of different time intervals after a magnetic field is changed in value by the pulse sequence in step b) and a corresponding plurality of gradient error function are calculated in step d).

6. The method as recited in claim 5 in which the optimal set of compensation parameter values are calculated in step e) using the plurality of gradient error functions.

* * * * *